(12) United States Patent
Iwabuki et al.

(10) Patent No.: US 10,106,189 B2
(45) Date of Patent: Oct. 23, 2018

(54) MOTOR DRIVE CONTROL DEVICE FOR ELECTRIC POWER STEERING

(71) Applicant: Mitsubishi Electric Corporation, Chiyoda-ku (JP)

(72) Inventors: Hiroyasu Iwabuki, Chiyoda-ku (JP); Kosuke Nakano, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 62 days.

(21) Appl. No.: 15/510,086

(22) PCT Filed: Jun. 12, 2015

(86) PCT No.: PCT/JP2015/067045
§ 371 (c)(1),
(2) Date: Mar. 9, 2017

(87) PCT Pub. No.: WO2016/117144
PCT Pub. Date: Jul. 28, 2016

(65) Prior Publication Data
US 2017/0305456 A1    Oct. 26, 2017

(30) Foreign Application Priority Data

Jan. 23, 2015   (JP) ................................. 2015-010805

(51) Int. Cl.
*H02P 6/10* (2006.01)
*B62D 5/04* (2006.01)
(Continued)

(52) U.S. Cl.
CPC ............ *B62D 5/0406* (2013.01); *B62D 5/04* (2013.01); *H01L 23/3675* (2013.01); *H02K 9/22* (2013.01);
(Continued)

(58) Field of Classification Search
CPC ........................................................ H02P 6/10
(Continued)

(56) References Cited

U.S. PATENT DOCUMENTS 8,212,512 B2 * 7/2012 Maeda ..................... H02P 3/14
318/400.22
2012/0313467 A1   12/2012 Omae et al.
(Continued)

FOREIGN PATENT DOCUMENTS

| JP | 10-80101 A | 3/1998 |
|---|---|---|
| JP | 2010-104212 A | 5/2010 |

(Continued)

OTHER PUBLICATIONS

International Search Report dated Sep. 8, 2015 in PCT/JP2015/067045 filed Jun. 12, 2015.

*Primary Examiner* — David S Luo
(74) *Attorney, Agent, or Firm* — Oblon, McClelland, Maier & Neustadt, L.L.P.

(57) ABSTRACT

A motor drive control device for electric power steering includes: a switching element for supplying current to a motor; a smoothing capacitor for reducing ripple current due to the switching element; a control board on which a drive circuit for controlling the switching element and a control circuit capacitor are mounted; a control signal line for supplying a control signal from the control board to the switching element; an electric connection member electrically connecting the switching element and the smoothing capacitor; and a heatsink portion in which the switching element is arranged in an embedded manner, wherein the electric connection member is arranged between the switching element and the control board, and the control circuit
(Continued)

capacitor and the smoothing capacitor are arranged in a space between the electric connection member and the control board.

9 Claims, 6 Drawing Sheets

(51) Int. Cl.
| | | |
|---|---|---|
| *H02K 11/33* | (2016.01) | |
| *H01L 23/367* | (2006.01) | |
| *H05K 5/00* | (2006.01) | |
| *H05K 7/02* | (2006.01) | |
| *H05K 7/20* | (2006.01) | |
| *H02K 9/22* | (2006.01) | |

(52) U.S. Cl.
CPC ............... *H02K 11/33* (2016.01); *H02P 6/10* (2013.01); *H05K 5/0043* (2013.01); *H05K 7/023* (2013.01); *H05K 7/2039* (2013.01)

(58) Field of Classification Search
USPC ............................................. 318/400.42, 700
See application file for complete search history.

(56) References Cited

U.S. PATENT DOCUMENTS

| | | |
|---|---|---|
| 2013/0119908 A1 | 5/2013 | Harada et al. |
| 2014/0306791 A1 | 10/2014 | Kanazawa et al. |

FOREIGN PATENT DOCUMENTS

| | | |
|---|---|---|
| JP | 2011-239574 A | 11/2011 |
| JP | 2013-63689 A | 4/2013 |
| JP | 2013-103535 A | 5/2013 |
| JP | 5414869 B1 | 2/2014 |
| JP | 2014-43122 A | 3/2014 |
| JP | 2014-207737 A | 10/2014 |

\* cited by examiner

MOTOR DRIVE CONTROL DEVICE FOR ELECTRIC POWER STEERING

TECHNICAL FIELD

The present invention relates to a motor drive control device for electric power steering, which performs drive control of a motor used in an electric power steering device for vehicle, for example.

BACKGROUND ART

An electric power steering device for automobile is configured to detect the rotation direction and rotation torque of a steering shaft rotated by a driver operating a steering wheel, and drive an electric motor so as to rotate in the same direction as the rotation direction of the steering shaft on the basis of the detected value, to generate steering assist torque.

Conventionally, the motor drive control device for electric power steering which performs drive control of a motor used in an electric power steering device adopts, as a small-sized and highly-reliable structure, a stacking structure having a storage space which is formed by a lid and a housing and stores: a power conversion circuit unit in which a smoothing capacitor and a MOSFET as a semiconductor switch configuring the drive control are arranged on the same metal substrate; a control circuit unit in which control circuit components such as a microcomputer are arranged; and a filter unit in which a filter is arranged (see, for example, FIG. 2 in Patent Document 1).

In another example of stacking structure, an upper-side cover and a lower-side heatsink sandwich therebetween: a control board on which surface mounted components for control circuit are mounted to form a control circuit; a power board on which surface mounted components for power are amounted; and a connector case located between the control board and the power board and integrated with an external-connection connector for connecting to the outside such as a power supply system or another ECU (see, for example, FIG. 2 in Patent Document 2).

CITATION LIST

Patent Document

Patent Document 1: Japanese Laid-Open Patent Publication No. 2013-63689 (FIG. 2)
Patent Document 2: Japanese Laid-Open Patent Publication No. 2013-103535 (FIG. 2)

SUMMARY OF THE INVENTION

Problems to be Solved by the Invention

However, in the motor drive control device for electric power steering which performs drive control of a motor used in an electric power steering device as described in Patent Document 1, since the MOSFET and the smoothing capacitor are arranged on the same metal substrate and are stacked in the storage space formed by the lid and the housing, the smoothing capacitor is influenced by heat generated from the MOSFET surface and is also influenced by heat from the housing to which the metal substrate is attached, thus causing a problem that increase in the temperature of the smoothing capacitor is promoted.

In the motor drive control device for electric power steering which performs drive control of a motor used in an electric power steering device as described in Patent Document 2, since the power mounted components such as a capacitor and a switching element are arranged on the same power board, there is the same problem as described above. In particular, a small-sized surface mounted capacitor is used on the power board, the capacitor is very easily influenced by heat from the surroundings because of the small thermal capacity of the capacitor, thus causing a problem that increase in the temperature thereof is promoted.

The present invention has been made to solve the above problems, and an object of the present invention is to provide a motor drive control device for electric power steering in which increase in the temperature of a smoothing capacitor having a temperature-dependent life is suppressed to improve the reliability and the height of the control device is decreased to achieve downsizing.

Solution to the Problems

A motor drive control device for electric power steering according to the present invention performs drive control of a motor used in an electric power steering device, and includes: a plurality of switching elements for supplying current to the motor; a smoothing capacitor for absorbing a ripple component of motor current flowing due to ON/OFF operations of the switching elements; a control board having, mounted thereon, a drive circuit for performing drive control of the switching elements, and a control circuit capacitor; a control signal line for supplying a control signal from the control board to the switching elements; an electric connection member electrically connecting the switching elements and the smoothing capacitor; and a heatsink portion in which the switching elements are arranged in an embedded manner, wherein the electric connection member is located between the switching element and the control board, and the control circuit capacitor and the smoothing capacitor are located in a space between the electric connection member and the control board.

Effect of the Invention

Owing to the configuration of the present invention, the smoothing capacitor is hardly influenced by heat from the switching element, the housing, and the heatsink portion. Therefore, increase in the temperature of the smoothing capacitor is suppressed and the reliability is improved. In addition, since the size of the control device is reduced in the height direction, the device can be downsized.

DESCRIPTION OF EMBODIMENTS

Embodiment 1

Hereinafter, a motor drive control device for electric power steering according to embodiment 1 of the present invention will be described with reference to FIG. 1 to FIG. 8.

Figure 1:
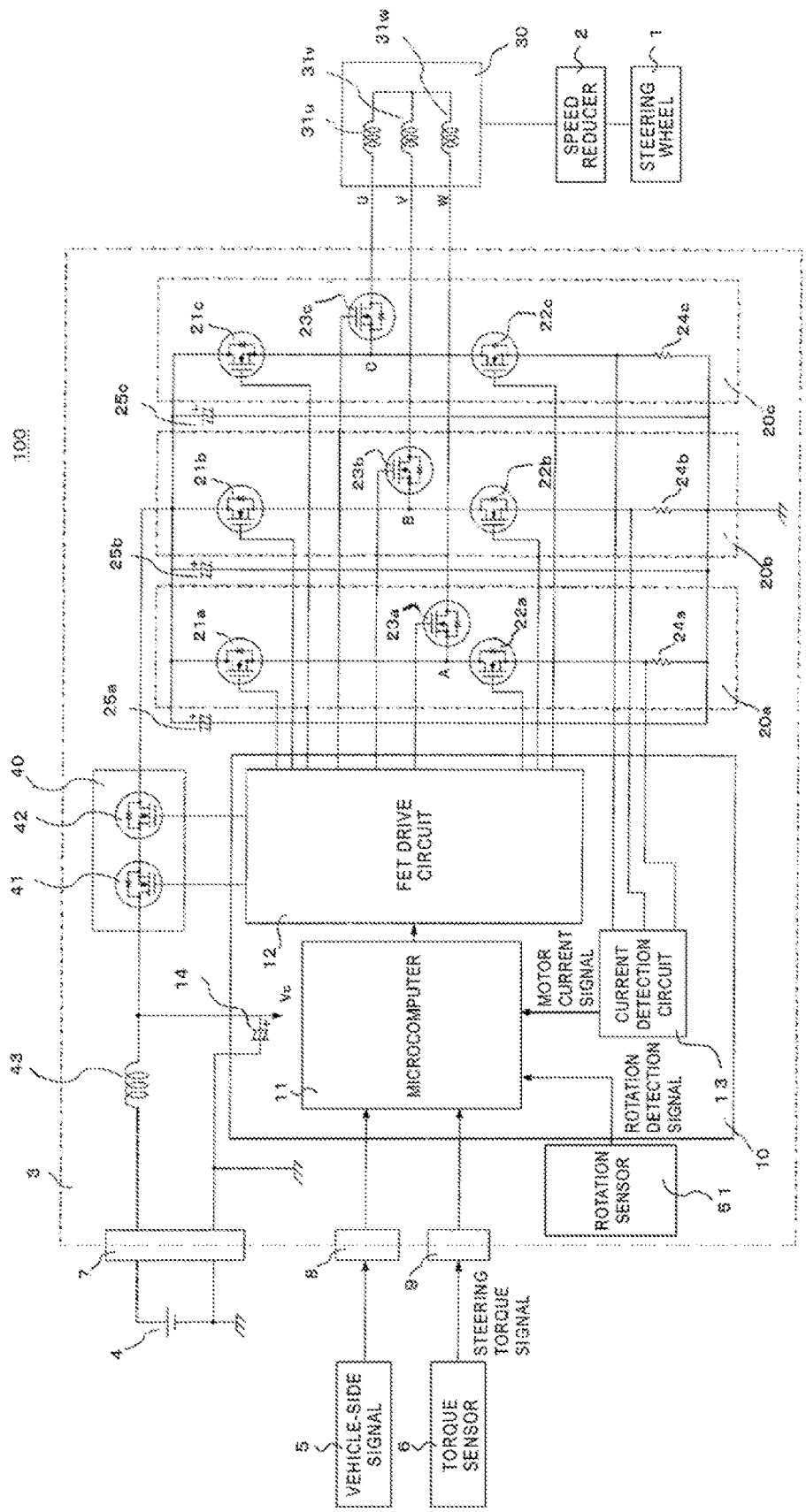
FIG. 1 is a circuit configuration diagram of an electric power steering device including a motor drive control device according to embodiment 1 of the present invention.
Figure 2:
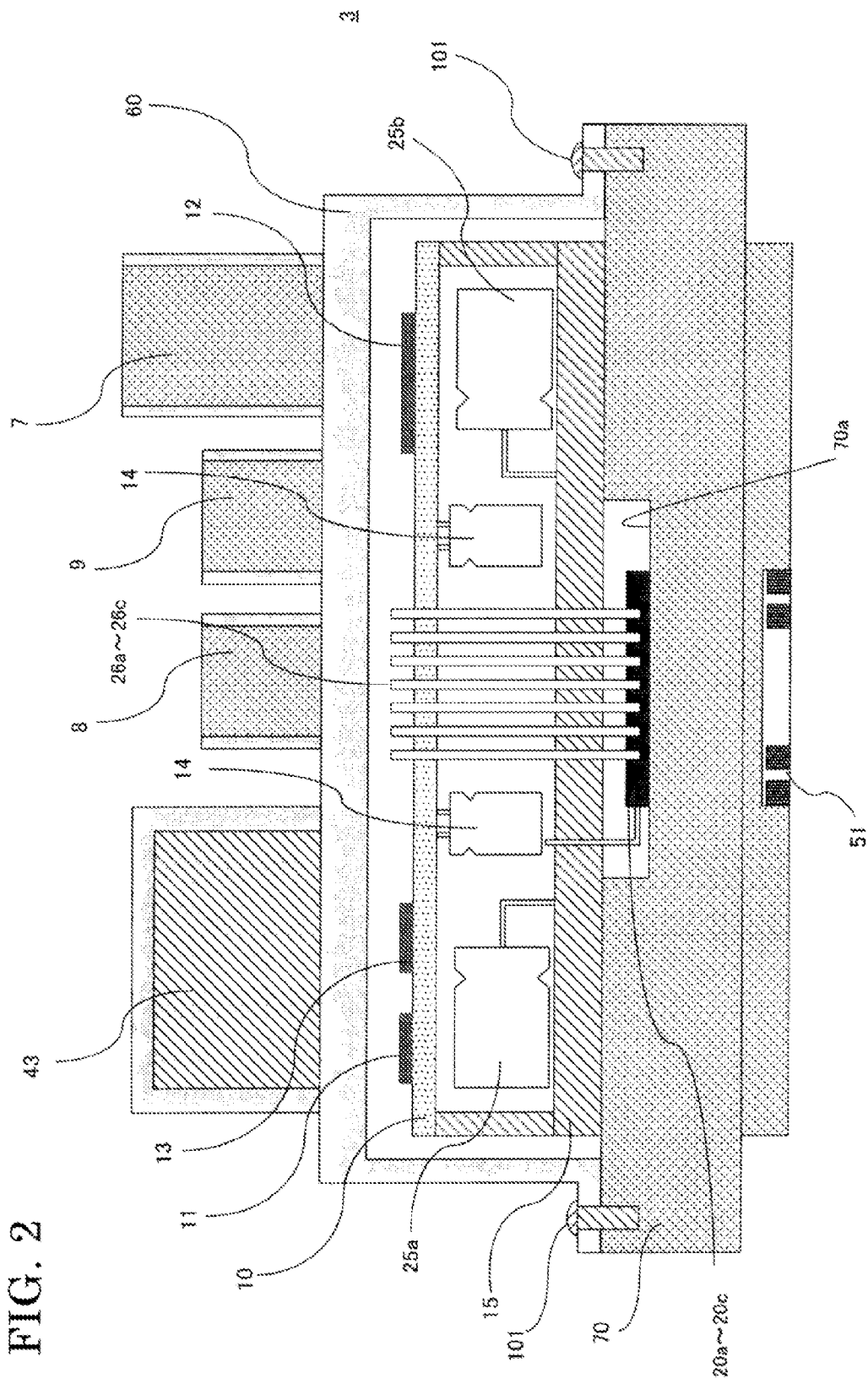
FIG. 2 is a structure diagram of the motor drive control device according to embodiment 1 of the present invention.

FIG. 1 is a circuit configuration diagram of an electric power steering device including the motor drive control device for electric power steering (hereinafter, simply referred to as a motor drive control device) according to embodiment 1. FIG. 2 is a structure diagram of the motor drive control device.

First, the entire circuit configuration of the electric power steering device will be described. In FIG. 1, the electric power steering device 100 includes: an electric motor 30 which outputs auxiliary torque to a steering wheel 1 of a vehicle; a motor drive control device 3 which controls driving of the electric motor 30; a speed reducer 2 which reduces the rotation speed of the electric motor 30; a battery 4 which supplies current for driving the electric motor 30; and a torque sensor 6 which is provided near the steering wheel of the vehicle and detects steering torque of the steering wheel 1 steered by a driver.

The electric motor 30 driven by the motor drive control device 3 is configured from a three-phase brushless motor, and has armature windings 31$u$, 31$v$, 31$w$ connected in a Y-connection manner.

The motor drive control device 3 includes: a power supply connector 7 which electrically connects the battery 4 and the motor drive control device 3; a vehicle-side signal connector 8 which receives a vehicle-side signal 5 such as a vehicle travelling speed signal from the vehicle side; and a torque sensor connector 9 which electrically connects the torque sensor 6 and the motor drive control device 3.

In addition, the motor drive control device 3 includes: smoothing capacitors 25$a$ to 25$c$ for absorbing a ripple component of motor current flowing through the electric motor 30; identical switching elements 20$a$, 20$b$, 20$c$ which form a three-phase bridge circuit for switching motor current in accordance with the magnitude and direction of the auxiliary torque to be outputted to the steering wheel 1; a coil 43 which prevents electromagnetic noise caused during switching operation of the switching elements 20$a$ to 20$c$ from flowing to the outside; a power supply relay 40 which is switch means for conducting and interrupting battery current supplied from the battery 4 to the switching elements 20$a$ to 20$c$ forming the three-phase bridge circuit; a control board 10 for controlling the ON/OFF states of the power supply relay 40 and the switching elements 20$a$ to 20$c$ forming the three-phase bridge circuit; and a rotation sensor 51 which detects the rotation rate of the electric motor 30.

The switching element 20$a$ has a field effect transistor (hereinafter, referred to as FET) 21$a$ and an FET 22$a$ with their ends connected to each other, the switching element 20$b$ has an FET 21$b$ and an FET 22$b$ with their ends connected to each other, and the switching element 20$c$ has an FET 21$c$ and an FET 22$c$ with their ends connected to each other. The FET 21$a$ of the switching element 20$a$ forms a U-phase plus-side arm of the three-phase bridge circuit, and the FET 22$a$ forms a U-phase minus-side arm thereof. The FET 21$b$ forms a V-phase plus-side arm of the three-phase bridge circuit, and the FET 22$b$ forms a V-phase minus-side arm thereof. The FET 21$c$ forms a W-phase plus-side arm of the three-phase bridge circuit, and the FET 22$c$ forms a W-phase minus-side arm thereof.

Other ends of the FET 21$a$ to FET 21$c$ are respectively connected to smoothing capacitors 25$a$ to 25$c$ for absorbing a ripple component of motor current flowing through the electric motor 30, by ON/OFF operations of the switching elements 20$a$ to 20$c$. The other ends of the FETs 22$a$ to 22$c$ are connected to the ground potential part of the vehicle via shunt resistors 24$a$ to 24$c$, respectively.

A connection point A at which the ends of the FET 21$a$ and the FET 22$a$ are connected, a connection point B at which the ends of the FET 21$b$ and the FET 22$b$ are connected, and a connection point C at which the ends of the FET 21$c$ and the FET 22$c$ are connected, serve as AC-side terminals for U, V, W phases of the three-phase bridge circuit. Ends of FETs 23$a$ to 23$c$ are respectively connected to the connection point A, the connection point B, and the connection point C of the switching elements 20$a$ to 20$c$, and other ends of the FETs 23$a$ to 23$c$ are respectively connected to U-phase, V-phase, W-phase terminals of the armature windings 31$u$, 31$v$, 31$w$ of the electric motor 30. The FETs 23$a$ to 23$c$ connected as described above are normally controlled to be ON by the control board 10, and serve to electrically disconnect the electric motor 30, i.e., serve as a motor relay, as necessary.

In embodiment 1, three identical switching elements are used as the switching elements 20$a$ to 20$c$. However, the switching elements 20$a$ to 20$c$ may be all integrated into one module, and an inverter circuit may be configured using the one module. In FIG. 1, one smoothing capacitor 25$a$ to 25$c$ is provided to each switching element 20$a$ to 20$c$. However, the number of the smoothing capacitors is not particularly limited and a necessary number of smoothing capacitors for absorbing a ripple component of motor current may be provided.

Two FETs 41, 42 provided to the power supply relay 40 have ends connected to each other, another end of one FET 41 is connected to the power supply connector 7 via the coil 43, and another end of the other FET 42 is connected to a plus-side DC terminal of the three-phase bridge circuit formed by the switching elements 20$a$ to 20$c$.

In FIG. 1, the power supply relay 40 is located between the coil 43 and the plus side of the switching elements 20$a$ to 20$c$ forming the three-phase bridge circuit, as an example. However, the power supply relay 40 may be located between the power supply connector 7 and the coil 43. In FIG. 1, one coil 43 is provided. However, a plurality of coils may be connected in series in order to disperse generated heat.

The control board 10 has, mounted thereon, a microcomputer 11, an FET drive circuit 12, a current detection circuit 13, and control circuit capacitors 14. The control circuit capacitors 14 are capacitors for supplying power Vc to semiconductor control elements and circuit elements constituting the microcomputer 11, the FET drive circuit 12, the current detection circuit 13, and the like mounted on the control board 10. As the control circuit capacitors 14, electrolytic capacitors are used in order to stably operate the control elements and the circuit elements.

When a driver operates the steering wheel 1 to apply steering torque to a steering shaft, the torque sensor 6 detects the steering torque, and a steering torque signal according to the detected torque is inputted to the microcomputer 11. The rotation sensor 51 is configured from a resolver or a magnetic sensor, and a rotation detection signal according to a steering rotation rate detected by the rotation sensor 51 is inputted to the microcomputer 11. Further, motor current flowing through the electric motor 30 is detected via ends of the shunt resistors 24a to 24c by the current detection circuit 13, and a motor current signal from the current detection circuit 13 is inputted to the microcomputer 11.

The microcomputer 11 calculates a control signal to be inputted to the FET drive circuit 12, on the basis of the steering torque signal from the torque sensor 6, the rotation detection signal detected by the rotation sensor 51, the vehicle-side signal 5 such as a vehicle travelling speed signal, and the motor current signal from the current detection circuit 13.

On the basis of the control signal from the microcomputer 11, the FET drive circuit 12 generates a gate drive signal at a predetermined timing, to perform conduction control of the switching elements 20a to 20c of the three-phase bridge circuit and the FETs of the power supply relay 40. Thus, the three-phase bridge circuit generates predetermined three-phase AC currents and supplies the three-phase AC currents to the armature windings 31u to 31v of the electric motor 30, to drive the electric motor 30.

Torque generated by the electric motor 30 is applied as assist torque to the steering shaft via the speed reducer 2. Thus, a driver's steering force to the steering wheel 1 is reduced. In FIG. 1, the case where the armature windings 31u to 31v of the electric motor 30 are connected in a Y-connection manner is shown as an example. However, the armature windings 31u to 31v may be connected in a delta-connection manner.

Next, the structure of the motor drive control device 3 in embodiment 1 of the present invention will be described with reference to FIG. 2. In FIG. 2, the side where the motor drive control device 3 is connected to the motor 30 is referred to as a front side of the motor drive control device 3, and the side not connected to the motor is referred to as a rear side of the motor drive control device. In the motor drive control device 3 according to embodiment 1, a cover 60, the control board 10, an electric connection member 15, and then a heatsink portion 70 are arranged in a stacked manner. The control board 10 has, mounted thereon: the microcomputer 11; the FET drive circuit 12 having a control element; the current detection circuit 13; and the control circuit capacitors 14 needed for supplying power to the control elements of the microcomputer 11 and the FET drive circuit 12. The control signal from the control board 10 is sent as an electric signal to each switching element 20a to 20c via control signal lines 26a to 26c connected to the respective switching elements 20a to 20c.

The switching elements 20a to 20c are formed by molding FET bare chips with resin and are provided with the shunt resistors 24a to 24c for the purpose of current detection. The semiconductor elements used for the switching elements 20a to 20c are high-speed semiconductor elements of voltage-control self-turn-off type, and MOSFET or IGBT is selected therefor. In the case of using wide gap semiconductors such as silicon carbide (SiC) or gallium nitride (GaN), it becomes possible to obtain a motor drive control device 3 having further reduced loss and a further reduced size, owing to the high-speed switching characteristics and the high-temperature operation characteristics of the wide gap semiconductors.

The switching elements 20a to 20c supply necessary current to the electric motor 30, to drive the electric motor 30. The switching elements 20a to 20c are arranged on the heatsink portion 70. The heatsink portion 70 is formed of metal such as aluminum and absorbs heat generated in the switching elements 20a to 20c, thus having a function to suppress increase in the temperature of the switching elements 20a to 20c.

The heatsink portion 70 has a recess 70a recessed to be deeper than the length in the thickness direction of the switching elements 20a to 20c so that the switching elements 20a to 20c are arranged therein in an embedded manner. By providing the heatsink portion 70 with the recess 70a recessed to be deeper than the length in the thickness direction of the switching elements 20a to 20c, the switching elements 20a to 20c can be completely embedded in the recess 70a of the heatsink portion 70. Therefore, the height of the motor drive control device 3 can be reduced, and at the same time, heat can be efficiently transmitted to the heatsink portion 70, whereby increase in the temperature of the switching elements 20a to 20c can be suppressed.

The switching elements 20a to 20c may be mounted on a metal substrate formed by providing an insulating layer on a base material such as aluminum and pasting a copper foil for circuit formation thereon, or a ceramic substrate formed of highly thermally conductive ceramic material and wiring conductors, and may have contact with the heatsink portion 70 via the substrate. The switching elements 20a to 20c may have contact with the heatsink portion 70 via an adhesive agent or solder. In such a configuration, heat generated in the switching elements 20a to 20c can be efficiently transmitted to the heatsink portion 70, whereby increase in the temperature of the switching elements 20a to 20c can be suppressed.

After the metal substrate or the ceramic substrate on which the switching elements 20a to 20c are mounted is embedded in the recess 70a of the heatsink portion 70, a highly thermally conductive insulating material such as mold resin or silicone gel may be injected into the recess 70a. In such a configuration, heat generated in the switching elements 20a to 20c can be efficiently transmitted to the heatsink portion 70, whereby increase in the temperature of the switching elements 20a to 20c can be suppressed, and in addition, electrically exposed parts of the switching elements 20a to 20c can be insulated, whereby the reliability can be further improved.

In FIG. 2, the FET 41 and the FET 42 of the power supply relay 40 are not shown, but they are arranged in an embedded manner in the recess 70a formed in the heatsink portion 70, as in the switching elements 20a to 20c.

On an end surface (rear side), of the heatsink portion 70, in which the recess 70a is formed, the electric connection member 15 formed of a metallic bus bar and an insulating resin is arranged in contact with the end surface so as to completely cover the switching elements 20a to 20c. Such a configuration can suppress influence of heat from the switching elements 20a to 20c and the heatsink portion 70 to the smoothing capacitors 25a to 25c (25c is invisible in FIG. 2, the same applies hereafter) provided on the rear side of the electric connection member 15, and to the control elements of the microcomputer 11 and the FET drive circuit 12 provided on the control board 10 attached on the rear side with respect to the electric connection member 15. Thus, the reliability can be further improved.

On the other end surface (front side) of the heatsink portion 70, the rotation sensor 51 is provided. The rotation sensor 51 may be configured using a resolver, or using a permanent magnet and a GMR sensor in combination.

The electric connection member 15 is located between the switching elements 20a to 20c and the control board 10, the smoothing capacitors 25a to 25c are located in a space between the electric connection member 15 and the control board 10, and the control circuit capacitors 14 mounted on the control board 10 are also located in this space.

The cover 60 is screwed by screws 101 to heatsink connection screw holes 92 (see FIG. 5) provided in the heatsink portion 70, so as to cover the control board 10 and the electric connection member 15. The connection between the heatsink portion 70 and the cover 60 may be made by an adhesive agent or a combination of a screw and an adhesive agent, without limitation to screwing.

The cover 60 is formed from metal or resin, and the cover 60 is integrally molded to have a space in which the power supply connector 7, the vehicle-side signal connector 8, the torque sensor connector 9, and the coil 43 are arranged.

Figure 3:
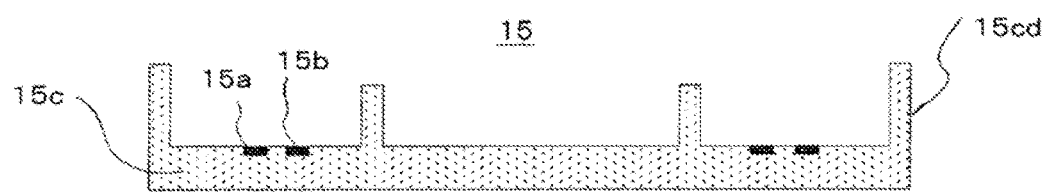
FIG. 3 is a sectional view of an electric connection member used in the motor drive control device according to embodiment 1 of the present invention.

FIG. 3 is a sectional view of the electric connection member 15. Supply of power to the switching elements 20a to 20c and electric connection between the switching elements 20a to 20c and the smoothing capacitors 25a to 25c are made via the electric connection member 15.

The electric connection member 15 has a flat-surface shape, and the size of the flat surface thereof is the same as or substantially equal to the flat-surface size of the control board 10. The electric connection member 15 is formed by arranging, on an insulating member 15c such as resin, conduction bus bars composed of a plus-side bus bar 15a and a minus-side bus bar 15b which are made of metal, or by molding a part or the entirety of the plus-side bus bar 15a and the minus-side bus bar 15b with the insulating member 15c such as resin.

The plus-side bus bar 15a and the minus-side bus bar 15b serve to supply current, and the insulating member 15c such as resin serves to ensure electric insulation between the conduction bus bars 15a, 15b and other components such as the heatsink portion 70, serves as a frame supporting the conduction bus bars, and further serves as a heat shield so that heat from the switching elements 20a to 20c and heat from the heatsink portion 70 are hardly transmitted to the smoothing capacitors 25a to 25c. In addition, the insulating member 15c such as resin has a rising flange 15cd around the periphery at the flat surface edge thereof so that a space is formed between the insulating member 15c and the control board 10.

By using the electric connection member 15 having the structure shown in FIG. 3, as shown in FIG. 2, a surface of the electric connection member 15 has contact with an end surface of the heatsink portion 70 and completely covers the switching elements 20a to 20c. Therefore, it is possible to suppress influence of heat from the switching elements 20a to 20c and the heatsink portion 70 to the smoothing capacitors 25a to 25c provided on the top surface of the electric connection member 15, and to the microcomputer 11 and the FET drive circuit 12 provided on the control board 10.

Figure 4:
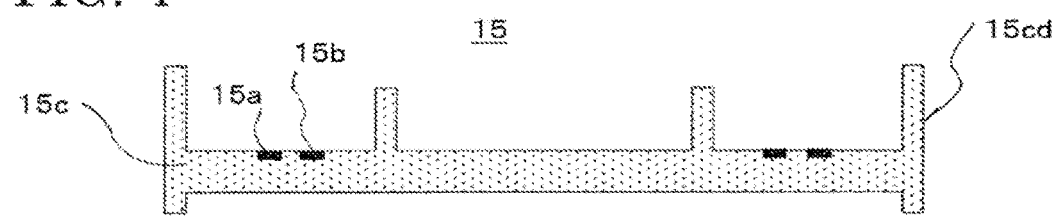
FIG. 4 is a sectional view of another example of the electric connection member used in the motor drive control device according to embodiment 1 of the present invention.

FIG. 4 is a view showing another structure of the electric connection member 15. As shown in FIG. 4, even in the case where the rising flange 15cd formed around the edge periphery of the insulating member 15c of the electric connection member 15 protrudes toward the heatsink portion 70 side which is opposite to the control board 10 side, an effect equivalent to the above effect can be obtained as long as the electric connection member 15 has a structure covering the region including the switching elements 20a to 20c.

Figure 5:
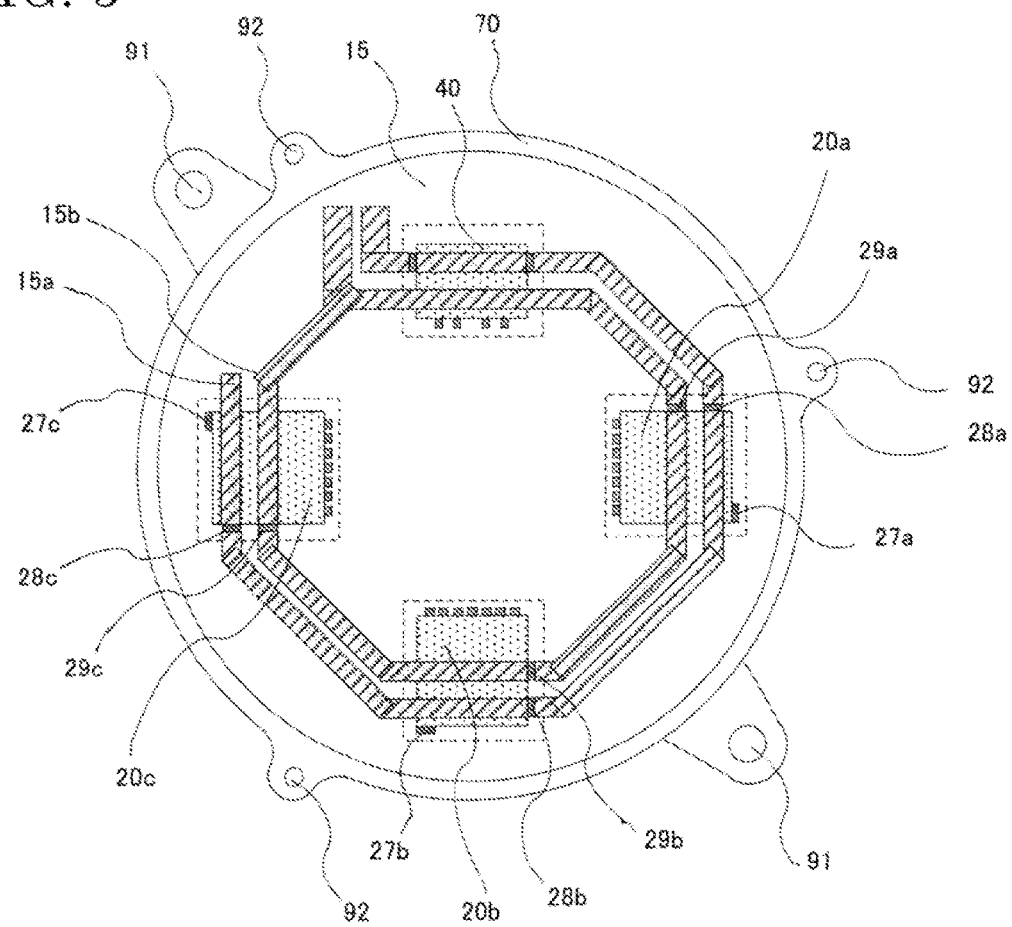
FIG. 5 is a view of the electric connection member used in the motor drive control device according to embodiment 1 of the present invention as seen from the top surface.

FIG. 5 is a view of the heatsink portion 70, the switching elements 20a to 20c, and the electric connection member 15 as seen from the rear side.

The plus-side bus bar 15a and the minus-side bus bar 15b of the electric connection member 15 are connected to the battery 4 via the power supply connector 7. The plus-side bus bar 15a and the minus-side bus bar 15b are arranged in parallel and closely to each other so as to have a looped shape. The plus-side bus bar 15a is connected to P terminals 28a to 28c of the respective switching elements 20a to 20c, and the minus-side bus bar 15b is connected to N terminals 29a to 29c of the respective switching elements 20a to 20c.

Such wiring enables reduction in the inductance of the bus bars, whereby surge voltage due to the inductance can be suppressed. In addition, the switching elements 20a to 20c and the power supply relay 40 can be arranged in a distributed manner on the entire surface of the heatsink portion 70, and therefore increase in the temperature can be uniformed among the switching elements 20a to 20c. Thus, the reliability of the motor drive control device 3 can be further improved.

The electric connection member 15 is provided with the smoothing capacitors 25a to 25c for reducing ripple current due to the switching elements 20a to 20c. As the smoothing capacitors 25a to 25c, a large-capacity aluminum electrolytic capacitor for absorbing a ripple component of motor current flowing through the motor 30, or a conductive polymer hybrid aluminum electrolytic capacitor having a small equivalent series resistance (ESR), is used, for example. In particular, the conductive polymer hybrid aluminum electrolytic capacitor is formed from a hybrid electrolyte having the characteristics of electrolytes of both a solid conductive polymer and a liquid electrolyte solution used for an aluminum electrolytic capacitor.

Therefore, the conductive polymer hybrid aluminum electrolytic capacitor has a low ESR and high ripple current characteristics at levels equivalent to a conductive polymer capacitor, and has low leakage current characteristics which are a feature of an aluminum electrolytic capacitor. Therefore, under the same ripple current characteristics, the size of the conductive polymer hybrid aluminum electrolytic capacitor is smaller than the size of the aluminum electrolytic capacitor, and thus the height of the motor drive control device 3 can be further decreased by using the conductive polymer hybrid aluminum electrolytic capacitor. Further, in the case where the length of the end surfaces of the smoothing capacitors 25a to 25c is smaller than the length of the side surfaces thereof, it is desirable to lay each smoothing capacitor horizontally such that the end surface thereof is perpendicular to the top flat surface of the electric connection member 15. By laying the smoothing capacitors in this way, the height of the motor drive control device 3 can be further decreased.

Figure 6:
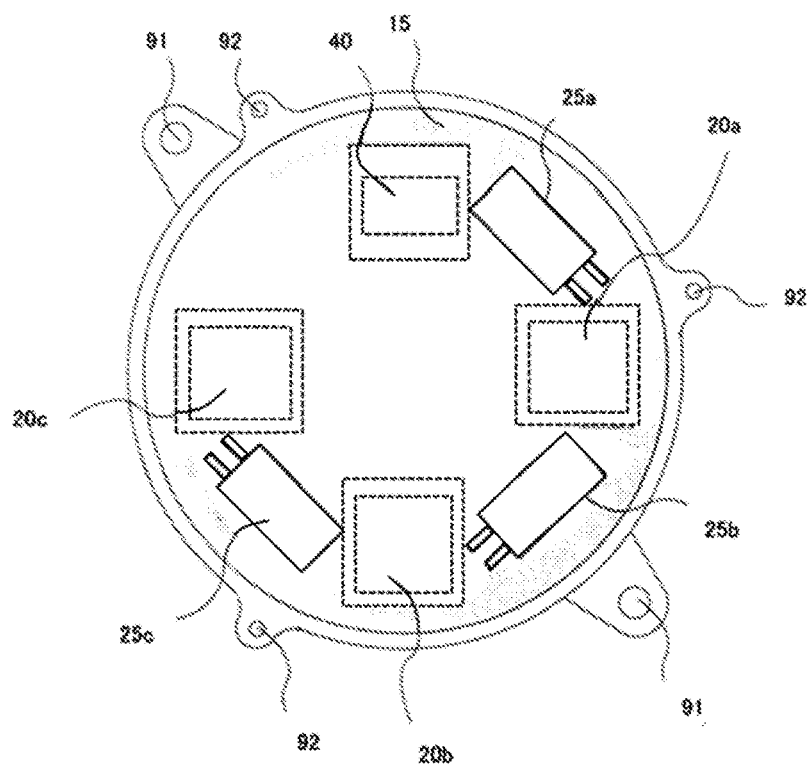
FIG. 6 is a view showing the positional relationship among elements used in the motor drive control device according to embodiment 1 of the present invention.

FIG. 6 is a view showing a positional relationship among the power supply relay 40, the switching elements 20a to 20b, and the smoothing capacitors 25a to 25c, which are attached to the heatsink portion 70, as seen from the rear side.

The power supply relay 40, the switching elements 20a to 20b, and the smoothing capacitors 25a to 25c are arranged at such locations that they do not vertically overlap each other as seen from the rear side.

Figure 7:
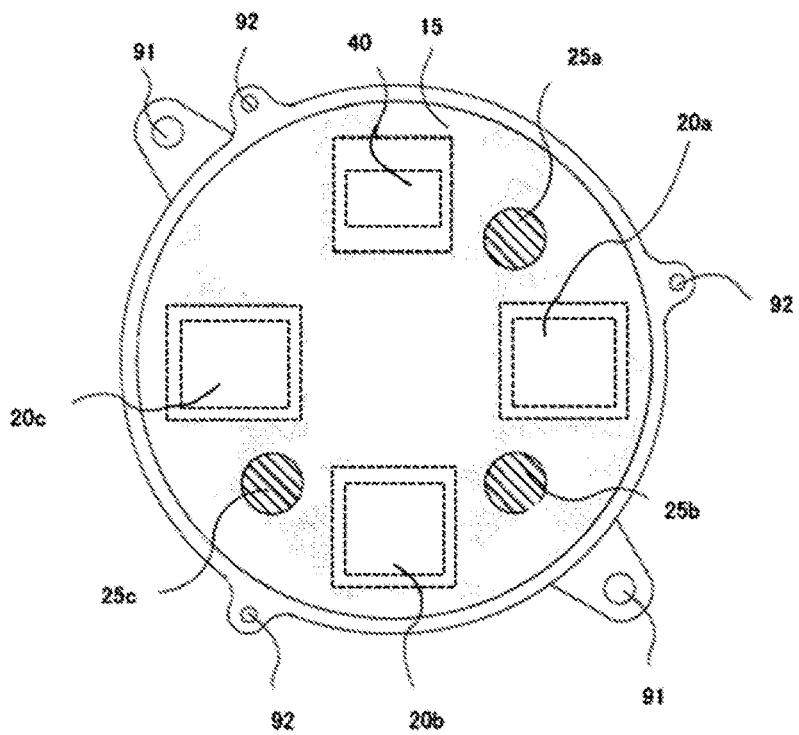
FIG. 7 is a view showing another example of the positional relationship among elements used in the motor drive control device according to embodiment 1 of the present invention.

FIG. 6 shows the case where the smoothing capacitors 25a to 25c are arranged along the circumferential direction, as an example. However, they may be arranged with their end surfaces directed inward or outward, or without limitation to horizontally-laying arrangement, they may be arranged to stand vertically as shown in FIG. 7. In any of these arrangements, the smoothing capacitors 25a to 25c are hardly influenced by heat generated from the switching elements 20a to 20b, and therefore the reliability can be further improved.

The control board 10 is formed from a multilayer (e.g., four layers) glass epoxy substrate, and the smoothing capacitors 25a to 25b are attached to the rear-side top surface of the electric connection member 15 such that the smoothing capacitors 25a to 25b are located between the control board 10 and the electric connection member 15.

As shown in FIG. 2, the control elements of the microcomputer 11 and the FET drive circuit 12, the current detection circuit 13, and the control circuit capacitors 14 needed for supplying power to the control elements, are mounted on the control board 10. The microcomputer 11, the FET drive circuit 12, and the current detection circuit 13 are provided on the rear-side surface of the control board 10, and the control circuit capacitors 14 are provided on the front-side surface of the control board 10 such that they are located in a space where the smoothing capacitors 25a to 25c are not located.

By using such a structure that the smoothing capacitors 25a to 25c and the control circuit capacitors 14 are located between the control board 10 and the electric connection member 15 as described above, it becomes possible to effectively utilize the space between the control board 10 and the electric connection member 15, whereby the motor drive control device 3 can be downsized. Further, the smoothing capacitors 25a to 25c and the control circuit capacitors 14 are hardly influenced by heat from the switching elements 20a to 20b, the microcomputer 11, and the FET drive circuit 12, and therefore the reliability can be further improved.

Figure 8:
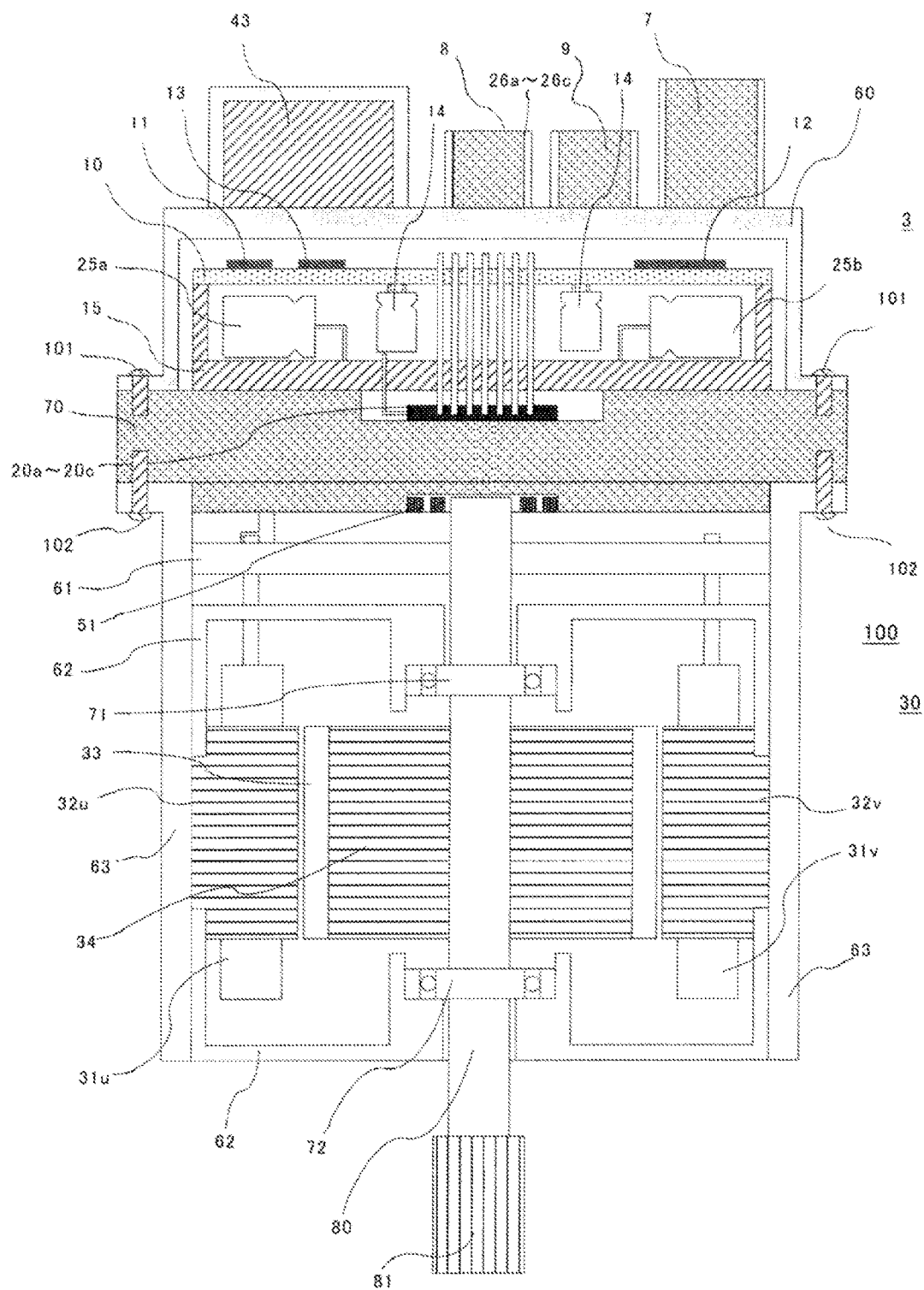
FIG. 8 is a structure diagram of an electric power steering device including the motor drive control device according to embodiment 1 of the present invention.

FIG. 8 shows an example of the structure of the electric power steering device 100 in which the motor drive control device 3 and the electric motor 30 are integrated. In the electric motor 30, armature windings 31 (31u, 31v, 31w) are wound around the stator cores 32 (32u, 32v, 32w), and a rotor having a rotor core 34 and a permanent magnet 33 is arranged being opposed to the stator core 32.

A shaft 80 is press-fitted into the rotor core 34 along the rotation axis, and a boss 81 which is a coupling with a gear shaft is press-fitted to an end of the shaft 80. The shaft 80 is supported by two bearings 71, 72, and the bearings 71, 72 are fixed to a cover 62, so that the rotor can be freely rotated. The rotation sensor 51 is provided at another end of the shaft 80. The cover 62 and the stator core 32 are fixed to the frame 63 by shrink-fit or the like. The frame 63 is formed from, for example, aluminum, and is screwed by a screw 102 to a frame connection screw hole 91 (see FIG. 5) provided in the heatsink portion 70.

The armature windings 31 (31u, 31v, 31w) are electrically connected to a bus bar (not shown) via a terminal 61, and the bus bar (not shown) is electrically connected to the motor drive control device 3. The bus bar (not shown) is supplied with current from FET output portions 27a to 27c (see FIG. 5) of the respective switching elements 20a to 20c of the motor drive control device 3, whereby the electric motor 30 can be driven.

The motor drive control device 3 is connected to the electric motor 30 via the heatsink portion 70 so that the motor drive control device 3 can be shielded by the heatsink portion 70 against influence of heat from the electric motor 30. Further, the smoothing capacitors 25a to 25c of the motor drive control device 3 can be shielded by the electric connection member 15 against heat from the heatsink portion 70 and the switching elements 20a to 20c, whereby the reliability can be further improved.

As described above, in embodiment 1 of the present invention, the motor drive control device for electric power steering includes: the switching elements 20a to 20c; the control circuit capacitors 14; the smoothing capacitors 25a to 25c; the electric connection member 15 electrically connecting the switching elements and the smoothing capacitors; the control board 10 having control circuit elements mounted thereon; the control signal lines 26a to 26c electrically connecting the switching elements 20a to 20c and the control circuit elements of the control board 10; and the heatsink portion 70 having a recess in which the switching elements are arranged in an embedded manner. The switching elements 20a to 20c are arranged in an embedded manner in the heatsink portion 70, the electric connection member 15 is arranged between the switching elements and the control board 10, and the control circuit capacitors 14 and the smoothing capacitors 25a to 25c are arranged between the control board 10 and the electric connection member 15. Therefore, the smoothing capacitors 25a to 25c are hardly influenced by heat from the switching elements 20a to 20c, the housing, and the heatsink portion 70, and increase in the temperature of the smoothing capacitors 25a to 25c is suppressed, whereby the reliability is improved. In addition, the size of the motor drive control device 3 is reduced in the height direction, whereby the device can be downsized.

Embodiment 2

Figure 9:
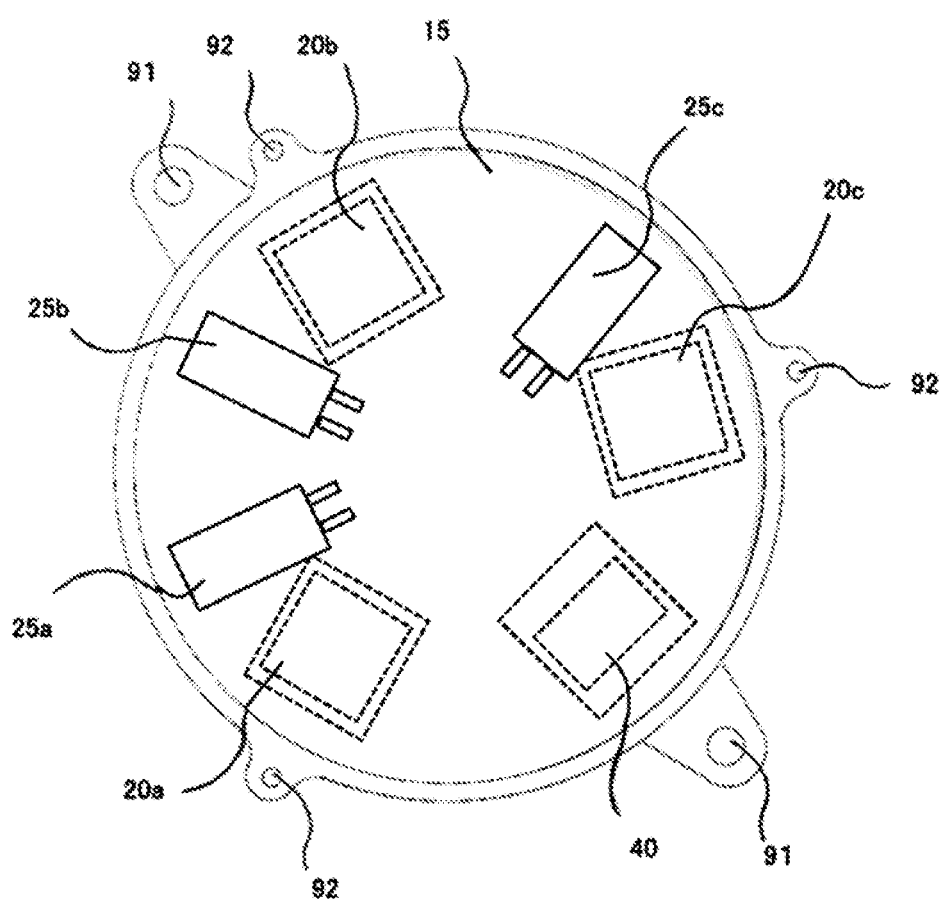
FIG. 9 is a view showing the positional relationship among elements used in a motor drive control device according to embodiment 2 of the present invention.

Next, the motor drive control device 3 in embodiment 2 of the present invention will be described with reference to FIG. 9.

In the invention of embodiment 2, components are provided in the same manner as in embodiment 1, and the electric circuit is also the same as in embodiment 1, and therefore a circuit configuration diagram and a structure diagram as shown in FIG. 1 and FIG. 2 are omitted. FIG. 9 is a view corresponding to FIG. 6 and showing the positional relationship among elements used in the motor drive control device 3.

In embodiment 1, as shown in FIG. 6, the power supply relay 40 and the switching elements 20a to 20b are equally arranged, and in a space among these elements, the smoothing capacitors 25a to 25c are equally arranged. On the other hand, in embodiment 2, as shown in FIG. 9, the switching elements 20a to 20c are arranged near the heatsink connection screw holes 92. The other configuration is the same as in embodiment 1, and the same or corresponding components are denoted by the same reference characters.

The heatsink connection screw holes 92 are formed as a part of the heatsink portion 70, and since the metal thickness at this part is greater than in the surrounding area, this part has a greater thermal capacity. Therefore, the effect of cooling the switching elements 20a to 20c increases, so that increase in the temperature thereof can be suppressed. In addition, the smoothing capacitors 25a to 25c provided on the rear-side surface of the electric connection member 15 are hardly influenced by heat generated from the switching elements 20a to 20b, and therefore the reliability can be further improved.

As seen from the rear-side surface of the electric connection member 15, the smoothing capacitors 25a to 25c and the switching elements 20a to 20c are arranged at such locations that they do not vertically overlap each other, so that the smoothing capacitors 25a to 25c are hardly influenced by heat from the switching elements 20a to 20c. Therefore, the reliability can be further improved.

Although embodiments of the present invention have been described above, the present invention is not limited to the embodiments, but various design modifications can be made, and within the scope of the present invention, the embodiments may be freely combined with each other, or each embodiment may be modified or simplified as appropriate.

DESCRIPTION OF THE REFERENCE CHARACTERS 3 motor drive control device
4 battery
10 control board
11 microcomputer
12 FET drive circuit
13 current detection circuit
14 control circuit capacitor
15 electric connection member
15a plus-side bus bar
15b minus-side bus bar
15c insulating member
20a, 20b, 20c switching element
25a, 25b, 25c smoothing capacitor
26a, 26b, 26c control signal line
30 electric motor
40 power supply relay
70 heatsink portion
70a recess
92 heatsink connection screw hole
100 electric power steering device

The invention claimed is:

1. A motor drive control device for electric power steering, which performs drive control of a motor used in an electric power steering device, the motor drive control device comprising:
    a plurality of switching elements for supplying current to the motor;
    a smoothing capacitor for reducing ripple current due to ON/OFF operations of the switching elements;
    a control board having, mounted thereon, a drive circuit for performing drive control of the switching elements, and a control circuit capacitor;
    a control signal line for supplying a control signal from the control board to the switching elements;
    an electric connection member electrically connecting the switching elements and the smoothing capacitor; and
    a heatsink portion in which the switching elements are arranged, wherein
    the control board, the electric connection member, and the heatsink portion are connected to the motor in a stacked manner in this order,
    a recess is formed in an end surface of the heatsink portion on a side not in contact with the motor, and the switching elements are arranged in the recess in an embedded manner,
    the electric connection member is located between the switching element and the control board,
    the control circuit capacitor and the smoothing capacitor are located in a space between the electric connection member and the control board, and
    the electric connection member is arranged in contact with the heatsink portion so as to cover the recess.

2. The motor drive control device for electric power steering according to claim 1, further comprising a thermally conductive insulating material injected in the recess.

3. The motor drive control device for electric power steering according to claim 1, wherein
    the plurality of switching elements are arranged in a distributed manner in the heatsink portion, and
    the smoothing capacitor and the switching elements are arranged at locations that do not overlap each other as seen from a top surface of the electric connection member.

4. The motor drive control device for electric power steering according to claim 1, wherein
    the smoothing capacitor is horizontally laid on the electric connection member so that an end surface of the smoothing capacitor is perpendicular to a top flat surface of the electric connection member.

5. The motor drive control device for electric power steering according to claim 1, wherein
    the electric connection member includes a conduction bus bar connecting a plus-side potential and a minus-side potential of a power supply, and an insulating member supporting the conduction bus bar.

6. The motor drive control device for electric power steering according to claim 1, further comprising a power supply relay for interrupting current flowing from a battery to the motor drive control device for electric power steering, wherein
    the power supply relay is arranged in an embedded manner in the heatsink portion.

7. The motor drive control device for electric power steering according to claim 6, wherein
    the plurality of switching elements, the smoothing capacitor, and the power supply relay are arranged at locations that do not overlap each other as seen from a top surface of the electric connection member.

8. The motor drive control device for electric power steering according to claim 1, wherein
    the heatsink portion in which the switching elements are arranged includes a heatsink connection screw hole, and the switching elements are located near the heatsink connection screw hole.

9. The motor drive control device for electric power steering according to claim 1, wherein
    the smoothing capacitor is a conductive polymer hybrid aluminum electrolytic capacitor.

* * * * *